US009740558B2

(12) United States Patent
Halbert et al.

(10) Patent No.: US 9,740,558 B2
(45) Date of Patent: Aug. 22, 2017

(54) ON-DIE ECC WITH ERROR COUNTER AND INTERNAL ADDRESS GENERATION

(71) Applicant: Intel Corporation, Santa Clara, CA (US)

(72) Inventors: John B Halbert, Beaverton, OR (US); Kuljit S Bains, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 11 days.

(21) Appl. No.: 14/865,956

(22) Filed: Sep. 25, 2015

(65) Prior Publication Data

US 2016/0350180 A1  Dec. 1, 2016

Related U.S. Application Data

(60) Provisional application No. 62/168,828, filed on May 31, 2015.

(51) Int. Cl.
*G11C 29/00*  (2006.01)
*G06F 11/10*  (2006.01)
*G11C 29/52*  (2006.01)
*G11C 29/42*  (2006.01)
*G11C 29/44*  (2006.01)
*G11C 11/40*  (2006.01)
(Continued)

(52) U.S. Cl.
CPC ...... *G06F 11/1068* (2013.01); *G06F 11/1048* (2013.01); *G11C 29/42* (2013.01); *G11C 29/44* (2013.01); *G11C 29/52* (2013.01); *G11C 11/40* (2013.01); *G11C 29/56008* (2013.01); *G11C 2029/0411* (2013.01)

(58) Field of Classification Search
CPC .......................... G06F 11/1068; G11C 29/52
See application file for complete search history.

(56) References Cited

U.S. PATENT DOCUMENTS

2009/0132876 A1  5/2009  Freking et al.
2010/0235713 A1  9/2010  Lee et al.
(Continued)

FOREIGN PATENT DOCUMENTS

EP           0862762 B1    10/2002

OTHER PUBLICATIONS

International Search Report and Written Opinion for PCT Patent Application No. PCT/US2016/034849, Mailed Sep. 8, 2016, 11 pages.

*Primary Examiner* — Sam Rizk
(74) *Attorney, Agent, or Firm* — Compass IP Law PC

(57) ABSTRACT

A memory subsystem enables managing error correction information. A memory device internally performs error detection for a range of memory locations, and increments an internal count for each error detected. The memory device includes ECC logic to generate an error result indicating a difference between the internal count and a baseline number of errors preset for the memory device. The memory device can provide the error result to an associated host of the system to expose only a number of errors accumulated without exposing internal errors from prior to incorporation into a system. The memory device can be made capable to generate internal addresses to execute commands received from the memory controller. The memory device can be made capable to reset the counter after a first pass through the memory area in which errors are counted.

23 Claims, 5 Drawing Sheets

(51) Int. Cl.
*G11C 29/56* (2006.01)
*G11C 29/04* (2006.01)

(56) References Cited

U.S. PATENT DOCUMENTS

| | | |
|---|---|---|
| 2010/0332900 A1 | 12/2010 | Yang |
| 2014/0250340 A1 | 9/2014 | Cordero et al. |
| 2014/0337688 A1 | 11/2014 | Billing et al. |
| 2015/0067437 A1 | 3/2015 | Bains et al. |
| 2015/0074498 A1 | 3/2015 | Varanasi |
| 2015/0223333 A1 | 8/2015 | Ware et al. |
| 2015/0234707 A1 | 8/2015 | Vogelsang et al. |
| 2016/0034346 A1 | 2/2016 | Michael |
| 2016/0041869 A1* | 2/2016 | Davis .................. G06F 11/1012 714/773 |
| 2016/0283318 A1 | 9/2016 | Das et al. |
| 2016/0284424 A1 | 9/2016 | Das et al. |

* cited by examiner

ON-DIE ECC WITH ERROR COUNTER AND INTERNAL ADDRESS GENERATION

RELATED CASES

This application is a nonprovisional patent application based on U.S. Provisional Patent Application No. 62/168,828, filed May 31, 2015. The present application claims the benefit of priority of that provisional application. The provisional application is hereby incorporated by reference.

FIELD

Embodiments of the invention are generally related to memory devices, and more particularly to a memory providing selective internal error correction information.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright© 2015, Intel Corporation, All Rights Reserved.

BACKGROUND

Computing devices use memory devices to store data and code for a processor to execute its operations. As the memory devices decrease in size and increase in density, they experience more errors during processing, referred to as yield issues. Thus, memory devices experience increasing bit failures, even with modern processing techniques. To mitigate bit failures, modern memory devices provide internal error correction mechanisms, such as ECC (error correction codes). The memory devices generate the ECC data internally, and use the ECC data internally at the memory devices. The internal error correction within a memory device can be in addition to whatever system-wide error correction or error mitigation the system is configured to use in data exchanges between the memory devices and the memory controllers.

SBEs (single bit errors) corrected by the memory devices appear to the memory controller or the host system as though there is no error. Thus, if additional errors accumulate in the memory device after manufacturing, the memory device will continue to perform ECC and the increasing number of failures of the memory device may not be visible to the host system. The memory device would traditionally need to identify information about internal error correction to provide information about error accumulation. However, exposing error correction information can provide proprietary information about processes and manufacturing, such as internal error information or details about internal error correction. There are currently no mechanisms to reveal information about the accumulation of errors within a memory device without exposing information about internal error correction.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, and/or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Figure 1:
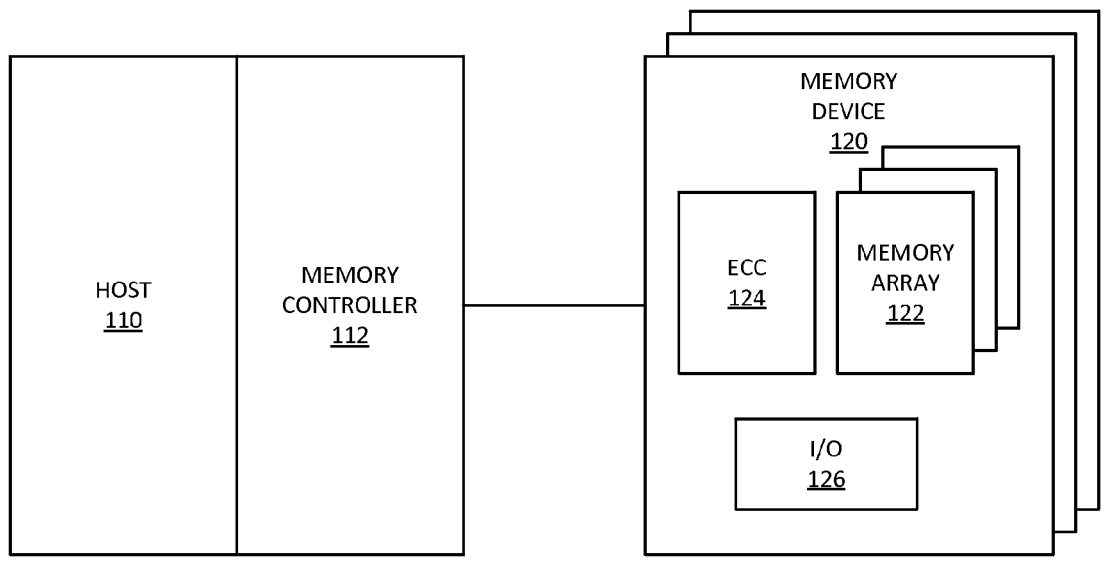
FIG. 1 is a block diagram of an embodiment of a system with a memory device that can expose internal error correction bits for use by an external memory controller.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, a memory subsystem enables managing error correction information. A memory device internally performs error detection for a range of memory locations, and increments an internal count for each error detected. The memory device includes ECC logic to generate an error result indicating a difference between the internal count and a baseline number of errors preset for the memory device. The memory device can provide the error result to an associated host of the system to expose only a number of errors accumulated without exposing internal errors from prior to incorporation into a system. In one embodiment, the memory device can generate internal addresses to execute commands received from the memory controller. In one embodiment, the memory device can reset the counter after a first pass through the memory area in which errors are counted.

In one embodiment, a memory device generates internal addresses to execute commands received from the memory controller. The memory device performs error correction to correct single bit errors (SBEs) in accessed data, and generates an error count indicating a number of SBEs corrected in excess of a baseline number of SBEs preset for the memory device. The memory device provides the error count to the memory controller to expose only a number of SBEs accumulated after manufacturing. In one embodiment, the memory device can reset the counter after a first pass through the memory area in which errors are counted.

Reference to memory devices can apply to different memory types, and in particular, any memory that has a bank group architecture. Memory devices generally refer to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR4 (DDR version 4, initial specification published in September 2012 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (LPDDR version 5, currently in discussion by JEDEC), HBM2 (HBM version 2, currently in discussion by JEDEC), and/or others, and technologies based on derivatives or extensions of such specifications.

Current designs of DRAM devices for technologies such as WIO2 and LPDDR4 are to internally include extra bits to store error correction data (such as ECC (error correction code) information). With internal ECC, the DRAM internally detects and corrects single bit errors (SBEs) using single error correction (SEC), which utilizes 8 dedicated ECC bits per 128 data bits. External data transfer size and internal prefetch size are both 128 bits in case of LPDDR4 and WIO2. But with internal ECC, these designs traditionally lack a method to track error accumulation within the DRAM, which makes the device vulnerable to accumulate errors until the number of errors overwhelms the ability of the on-die or internal ECC to correct SBEs. If too many errors accumulate, the device will pass data to the memory controller with uncorrected errors, resulting in failures.

If the DRAM does not perform internal error correction, the system may be able to perform system-level error correction, but then all errors within the DRAM would be visible. Exposing information about all errors would expose internal error information, which can reveal information that is proprietary to memory device manufacturers, and generally considered undesirable to share within the industry. As described herein, the system can provide a relative error count to indicate how many errors have accumulated since the memory device was shipped or deployed in a system. The relative error as described herein can indicate how many errors have accumulated in excess of a baseline number of errors. The baseline number of errors for the memory device is the number of errors detected during manufacturing testing. The accumulation of errors can be determined by counting the total number of errors as compared to the baseline number. However, seeing that even internal errors detected during manufacturing can be proprietary information, the device manufacturer can configure such a number internally and configure the memory device to expose only the accumulated difference.

Typically, during normal operation a DDR4 DRAM device enabled for internal ECC does not signal that it has corrected a single bit error. In one embodiment, during manufacturing, the total number of single bit errors on the device is permanently stored in the memory device. For example, the number of errors can be stored in an error threshold register. The error threshold count stored represents the total number of single bit errors detected during manufacturing test. In one embodiment, the error threshold register is not directly readable by the user and/or the host system. In one embodiment, the memory device includes an error counter to count SBEs along with a comparator to compare the results of the error counter with the error threshold register.

In one embodiment, the memory device includes an address generator to generate internal addresses for commands received. Thus, the memory device can control what locations of the memory device are to be accessed and when. The memory device can then manage error detection internally and count the number of errors relative to the baseline number of errors. Generating the addresses internally can enable the memory device to internally reset an error accumulation counter and prevent the internal error count from continuing to increase. Without resetting the counter after a first pass through the memory space, a user could potentially run an error test twice with the errors continuing to accumulate, and then simply divide the number of errors in half to expose information about internal errors and internal error correction. By resetting the counter, each time the error test is executed, it will reveal the same number of errors, even when run consecutively.

In one embodiment, the error counter is cleared during reset. In one embodiment, the error counter is enabled by setting a mode register bit (e.g., MRx bit A[y]) and initially cleared. Once enabled, the counter can be incremented for every read that detects a single bit error. One single pass through the array is allowed by only allowing the DRAM to generate the addresses to read the array. Once a single pass through all of the memory locations is completed, in one embodiment, control logic reads the relative error count result and resets the counter. In one embodiment, the relative error count can be stored in a multipurpose register, which can then be read out by the host (e.g., the memory controller). For example, the memory device can store the relative error count in a multipurpose register, such as an MPR3, page 3 register. In one embodiment, the register or other storage location includes a count representing the difference between the number of errors detected since the register was enabled and the stored error count. In one embodiment, in addition to reporting accumulated errors, the memory device can also report an address of a row or rows that contain the highest number of errors. In one embodiment, the memory device can report how many errors are contained in the row with the highest number of errors. In one embodiment, on-die or DRAM internal counters can generate the internal addresses for a read error pass through the memory resources or array of the memory device. At the start of the read error pass through the array, the relative error count result register can be cleared. After one pass through the array the relative count can be read out of the DRAM. In one embodiment, if a second pass is attempted, then the error result register is cleared prior to the second pass being started.

FIG. 1 is a block diagram of an embodiment of a system with a memory device that can expose internal error correction bits for use by an external memory controller. System 100 includes elements of a memory subsystem in a computing device. Host 110 represents a host computing platform that executes an operating system (OS) and applications. The OS and applications execute operations that result in memory accesses. Host 110 includes a processor or processing unit, which can be a single or multicore processor. System 100 can be implemented as an SOC, or be implemented with standalone components. When multiple memory devices 120 are included in system 100, each memory device can individually manage its internal ECC, separate from the host or from other memory devices.

Memory controller 112 represents control logic that generates memory access commands in response to the execution of operations by the processor(s). In one embodiment, system 100 includes multiple memory controllers. In one embodiment, system 100 includes one or more memory controllers per channel, where a channel couples to access a number of memory devices. Each channel is an independent access path to memory, thus, multiple different memory accesses can occur in parallel on different channels. In one embodiment, memory controller 112 is part of host 110, such as logic implemented on the same die or package space as a host processor. Thus, the memory controller can be implemented as part of the same die as the host processor or coupled to the host processor in a system on a chip (SoC) configuration.

Memory devices 120 represent memory resources for system 100, and can be, for example, a DRAM device. Memory devices 120 each include multiple memory arrays 122. Memory arrays 122 represent the logic where memory device 120 stores the data bits. Memory device 120 includes I/O logic 126, which represents interconnection logic to enable the memory device to couple to memory controller 112. I/O logic 126 can include a command/address bus (often referred to as a C/A bus, CMD/ADDR bus, or ADD/CMD bus). I/O logic 126 can also include a data bus, and other signal lines. I/O logic 126 can include signal lines, connectors, drivers, transceivers, termination control, and/or other logic to enable communication between the memory controller and memory device.

In one embodiment, memory device 120 includes ECC 124, which represents logic and memory to implement internal error correction. Thus, ECC 124 represents the ability of memory device 120 to generate and use internal error correction bits. In one embodiment, ECC 124 is part of an internal controller within memory device 120 (not specifically shown). Such an internal controller controls the operation of the memory device, such as the receiving and processing of commands, as well as the execution of commands, including controlling the timing of operations to execute the commands and return data in response to a request from the memory controller (external to the memory device). In one embodiment, ECC 124 can be implemented in whole or in part as a circuit separate from an internal controller. In one embodiment, ECC 124 enables memory device 120 to perform a read of each memory location in the range of addresses and detect and correct SBEs, and increment an error count for each SBE corrected.

In one embodiment, memory controller 112 generates a command or request for an ECC count to determine accumulated errors from memory device 120. For purposes of simplicity in description, consider that ECC 124 processes such a request and can generate a count to respond to such a request. ECC 124 can cause the memory to perform a series of operations to detect errors in response to an error testing command received from the memory controller. For example, ECC 124 can include or have access to a counter that is incremented to keep track of errors detected in the memory locations read. As described herein, memory device 120 can generate addresses for a sequential run through the memory locations of a memory space or a range of memory address location to be tested for errors.

In one embodiment, ECC 124 determines a number of errors in the memory space, and generates a count of the errors corrected. In one embodiment, ECC 124 generates a relative error count by calculating a difference between the number of errors detected and a known number of errors preset for the memory device prior to deployment. For example, the error preset can be a threshold or a baseline number generated during manufacturing testing to detect a number of errors present in the device at manufacturing. In one embodiment, ECC 124 includes or has access to comparator logic that can calculate the difference based on the threshold.

In one embodiment, when ECC 124 receives a consecutive command to perform the error testing, it will determine when the entire memory space of memory array 122 has been tested, and can reset the error count. Thus, each time the error checking is performed, ECC 124 can start the error count over, and the difference between the count generated and the preset number indicating the threshold or baseline number of errors for the device will also restart each time. In one embodiment, ECC 124 can also reset the error count in response to a start condition, when the memory subsystem is reset.

Figure 2:
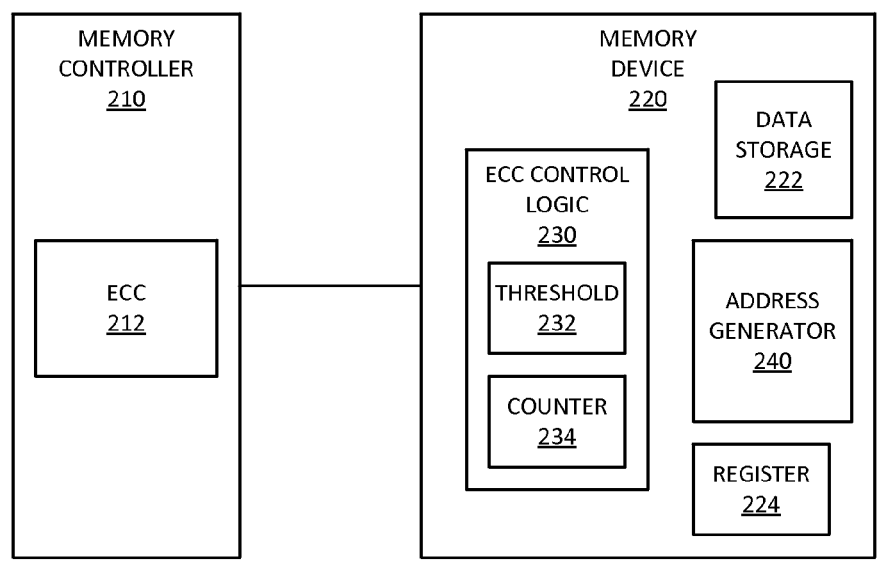
FIG. 2 is a block diagram of an embodiment of a system with a memory device that can expose internal error correction bits for use by an external memory controller.

FIG. 2 is a block diagram of an embodiment of a system with a memory device that can expose internal error correction bits for use by an external memory controller. System 200 is one example of an embodiment of system 100 of FIG. 1. System 200 illustrates address generation logic 240 within memory device 220 to generate addresses for internal operation in response to command received from memory controller 210. Memory device 220 and memory controller 210 communicate via I/O interfaces between the devices (not specifically shown).

Address generation 240 can include an address counter that is used by an internal controller (not specifically shown) within memory device 220 to determine what address space to address an operation, such as a read to detect errors. Traditionally, a memory controller generates the addresses for ECC testing, and the memory device simply executes the commands provided at the addresses indicated by the memory controller. However, with address generation 240 within memory device 220, the memory controller can simply generate a command or a request for ECC testing, and allow the memory device itself to generate the addresses internally. Address generation 240 can include a mechanism (e.g., a counter) to track the addresses tested. Thus, the memory device itself can manage error correction testing.

Memory device 220 includes data storage 222, which represents storage space in memory device 220 where the memory device writes data received from memory controller 210 and accesses stored data to send to memory controller 210. In one embodiment, memory device 220 includes ECC logic 230. ECC logic 230 represents logic the memory device uses to compute error correction. For example, ECC logic 230 can enable memory device 220 to detect and correct SBEs for data fetched from memory locations within a range of addresses tested. ECC logic 230 can represent logic within memory device to control the application of error correction from internally within memory device 220 to externally at memory controller 210. ECC logic 230 can be implemented at least in part within a processor device, such as by an internal controller of memory device 220. In one embodiment, ECC logic 230 is implemented in whole or in part within a circuit separate from the internal controller.

In one embodiment, ECC control logic 230 includes or uses information stored within memory 220. More specifically, ECC control logic 230 can use threshold 232, which represents a baseline number of errors for memory device 220. In one embodiment, BIOS (basic input/output system) or other logic can determine the baseline number of errors and write the number for persistent storage within a register or other storage location in memory device 220. By use of threshold 232, ECC control logic 230 can generate an error output that indicates a number of accumulated errors, without exposing the baseline number. For example, the error output can indicate a number of SBEs corrected in excess of the baseline number of SBEs preset for the memory device.

In one embodiment, ECC control logic 230 includes or uses counter 234, which is a counter that indicates how many errors are present (e.g., how many SBEs detected and corrected) in data storage 222. Counter 234 can be reset by ECC control logic 230 on each pass through the data storage space to determine how many errors are present. Thus, counter 234 can accumulate a count for each error detected, but will not continue to accumulate errors once the entire storage space has been checked. In one embodiment, checking the storage space again will cause ECC control logic 230 to determine that address generator 240 has reached the maximum address of the storage space, and will thus reset counter 234 in response to detecting that the counter has rolled over. The counter rolls over when address generator 240 completes all addresses and returns to a starting address.

In one embodiment, ECC control logic 230 can generate an error output including an indication of a row having the highest number of accumulated errors. Thus, in one embodiment, ECC control logic 230 accumulates errors on a per-row basis, and identifies a row with the highest number of errors. For example, counter 234 can include multiple counters. Counter 234 can include a counter for each row, which can all be summed to obtain a total number of errors detected. Counter 234 can include a global counter to accumulate all errors for all rows, and a row counter that is reset at the end of each row. Such an individual row count can be compared against a highest row count, and if the count exceeds a current highest count, the new count can be stored in a storage location and the address of the row can also be stored. In one embodiment, if the count is the same as the highest count, the count will not be changed, but multiple row addresses will be stored. When providing an error result to memory controller 210, ECC control logic 230 can report a total number of accumulated errors, and an indication of a row with the highest error count. Reporting the row with the highest error count can include reporting the count for the row and the address of the row or rows that had the highest count. In one embodiment, reporting the row with the highest error count includes reporting the row address, and not the count of the number of errors.

In one embodiment, memory device 220 includes register 224, which represents one or more storage locations or registers where ECC control logic 230 can store error count and/or error reporting data. For example, ECC control logic 230 can record a total number of accumulated errors in excess of a threshold for memory device 220 in register 224. In one embodiment, register 224 includes a mode register or multipurpose register or other storage location. In one embodiment, register 224 can include or point to other storage locations that store row address information indicating one or more rows with the highest number of errors. In one embodiment, register 224 represents storage within memory device 220 accessible by memory controller 210, which enables memory controller 210 to access the reporting data. In one embodiment, memory device 220 sends the reporting data to memory controller 210.

In one embodiment, memory controller 210 includes ECC 212, which represents ECC logic for use at the system level in system 200. It will be understood that ECC control logic 230 is logic within each memory device coupled to memory controller 210, which ECC 212 represents logic within memory controller 210 to perform ECC on data received from each memory device. The results of the operation of ECC control logic 230 can be transparent to memory controller 210, by performing ECC operations on the data and then transferring the data to the memory controller. In one embodiment, ECC 212 is logic included within a circuit of memory controller 210. In one embodiment, ECC 212 is logic external to a memory controller circuit, which is accessible by the memory controller, and can perform one or more operations related to ECC within system 200. For example, in one embodiment, ECC 212 can include an ECC circuit in a processor or SoC coupled to memory controller 210.

However, memory controller 210 can also provide ECC for system 200, which can be based not only on data from one memory device 220, but from multiple connected memory devices. Thus, not only can the error count from memory device 220 as described herein provide information about the life of the memory device itself, but it can also operate as metadata to memory controller 210 for system-level ECC implementations. By knowing about corrected errors from the memory device level, the memory controller can adjust its operation of error correction.

Figure 3:
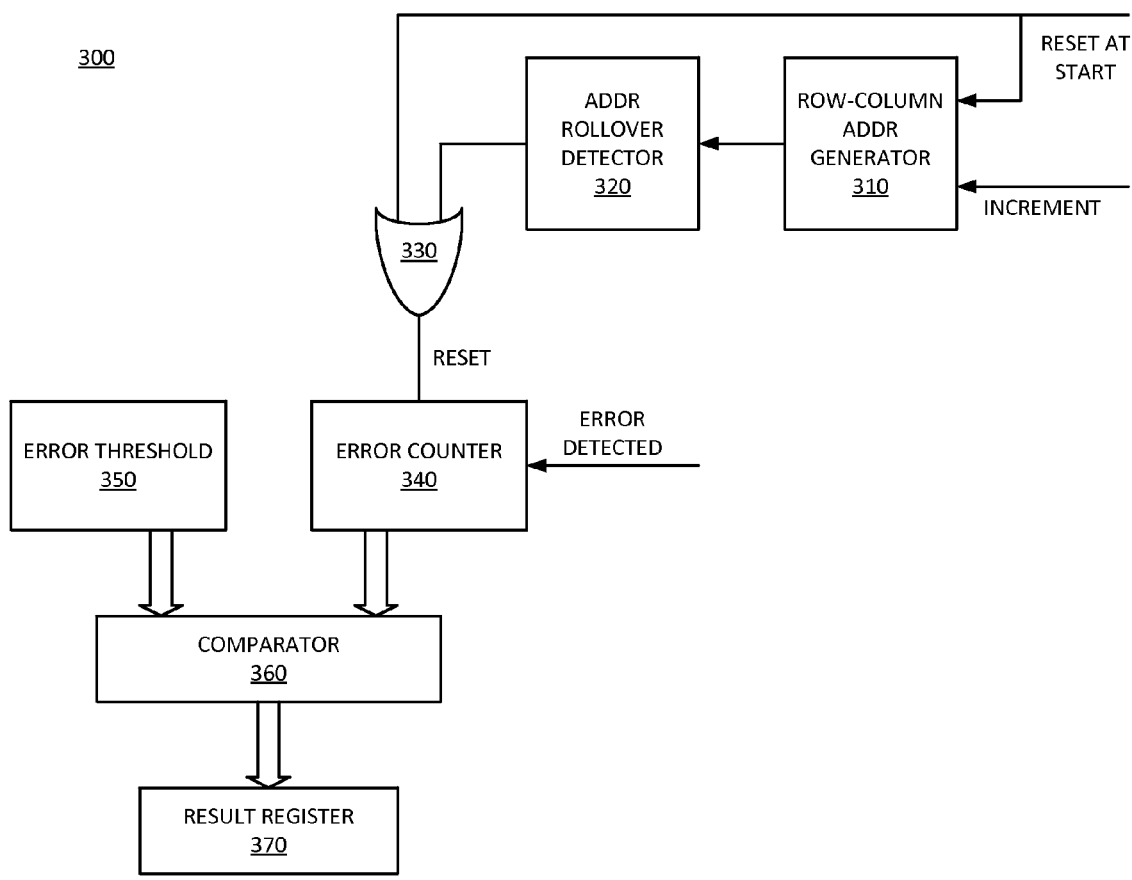
FIG. 3 is a block diagram of an embodiment of a system in which a memory device generates internal addresses for executing received commands.

FIG. 3 is a block diagram of an embodiment of a system in which a memory device generates internal addresses for executing received commands. System 300 is one embodiment of ECC control logic in accordance with system 100 and/or system 200. It will be understood that system 300 can be part of the logic of a system, and additional logic (not specifically shown) can be included. For example, system 300 can represent logic specifically for exposing errors in excess of a threshold, and does not specifically illustrate the logic used to perform the error detection or receive and process commands.

In one embodiment, ECC control logic receives a command to initiate an ECC test. In one embodiment, the ECC control logic is part of an on-die controller within the memory device. The controller controls the operation of the memory device, including generating internal commands and/or control signals to cause the operations needed to execute commands received by the memory device. The control logic can generate a reset at start signal, and pass the signal to a row-column address generator 310 internal to a memory device. The start can be any time the device is powered up and initialized, as well as any time a host computer system is configured to perform an ECC test to determine a number of accumulated errors. The reset at start signal can be a binary (true/false) signal indicating whether to reset a counter.

In one embodiment, the on-die controller can generate an increment signal. The increment signal can signal the incrementing of the operations to a subsequent operation. In one embodiment, the on-die controller provides the increment signal as an input to address generator 310. Address rollover detector 320 can determine when the incrementing of the counter results in the counter starting back at an initial address. Address rollover detector 320 can generate an output indicating the rollover. In one embodiment, the output is a binary (true/false) signal indicating a rollover condition.

In one embodiment, address rollover detector 320 provides its output to XOR logic 330. In one embodiment, ECC control logic also provides the reset at start signal as an input to XOR logic 330. XOR logic 330 can perform an XOR (exclusive OR) operation on the two input signals, and output a binary output if either condition is true. In one embodiment, if either condition is true, system 300 resets error counter 340. Thus, consider as example conditions where if the system is initialized, the counter is reset, or if the address of the internal address generator rolls over to begin at the initial address again, the counter is reset.

Other than the reset operation, error counter 340 can receive as input an error detection signal. Error detection logic (not specifically shown) detects errors in memory locations, and can generate a binary signal indicating the error. In one embodiment, error counter 340 receives the error indication signal and increments the error count each time an error is detected. Thus, error counter 340 can accumulate errors, and system 300 can reset the error count upon conditions of reset on start and address rollover.

Error threshold 350 represents the threshold number or the baseline number of errors expected for the memory device in which system 300 is incorporated. Error threshold 350 can be set by manufacturing testing, and does not change during the life of the memory device. Comparator 360 can determine a difference between error threshold 350 and error counter 340. The count in error counter 340 in excess of error threshold 350 is provided to result register 370. It will be understood that by storing only the difference between error threshold 350 and error counter 340, the system can report only accumulated errors without exposing information about internal errors. In one embodiment, result register 370 is available to a host system for reading to determine a number of errors accumulated over the life of a memory device, excluding the number of errors present at manufacturing of the device.

In one embodiment, in addition to result register 370, or as part of result register 370, system 300 includes storage to indicate a row or rows of data with the highest number of errors. In one embodiment, system 300 stores the address information for the row or rows and reports the addresses to an associated memory controller. In one embodiment, address generator 310 records an address of a row if the row is determined to have the highest number of errors or equal to the highest number of errors.

Figure 4:
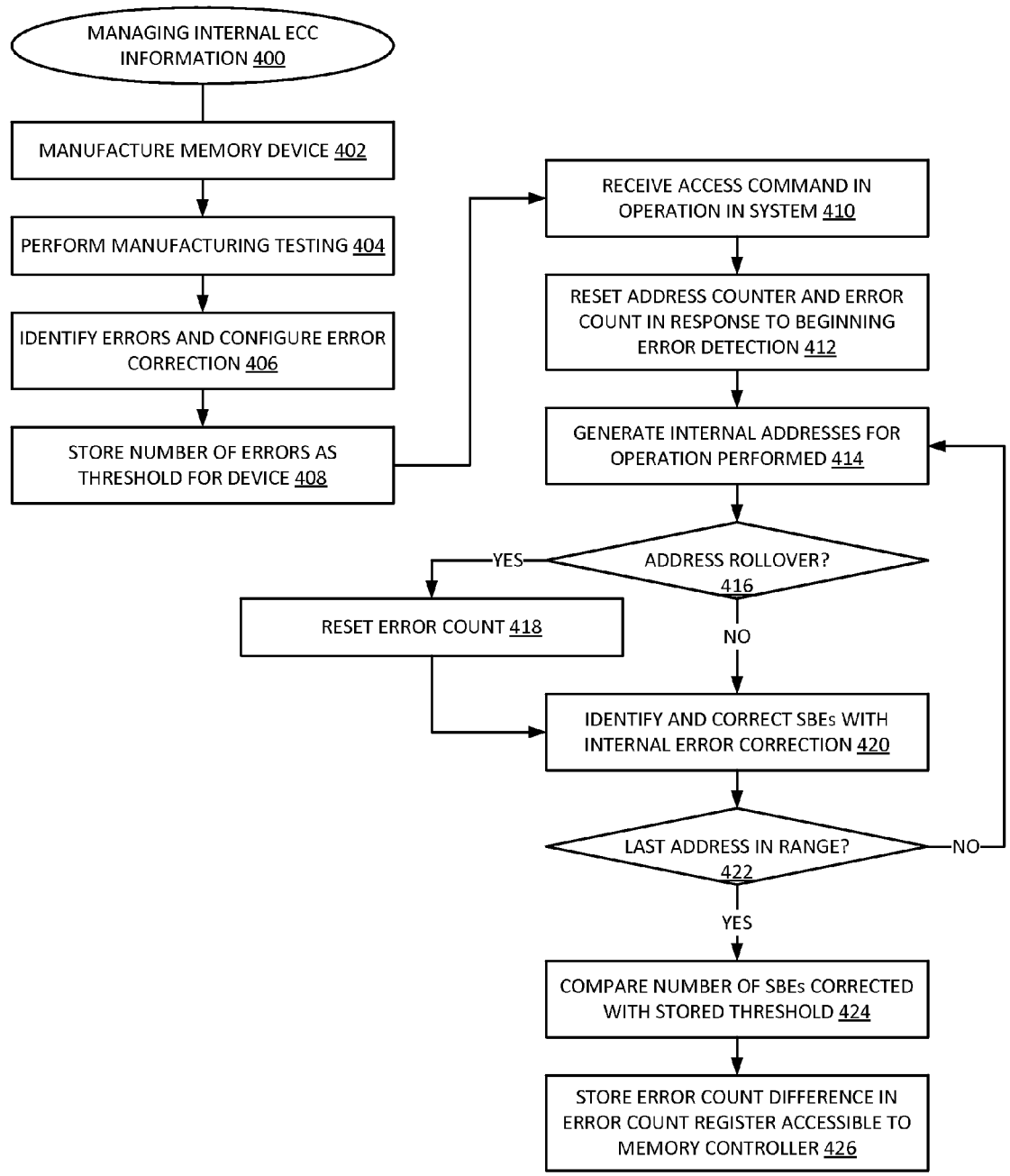
FIG. 4 is a flow diagram of an embodiment of a process for managing internal ECC information including generating internal addresses.

FIG. 4 is a flow diagram of an embodiment of a process for managing internal ECC information including generating internal addresses. Process 400 enables ECC logic internal to a memory device to manage internal ECC information that can be exposed selectively to an associated memory controller/host. A manufacturer manufactures a memory device, 402, and performs manufacturing testing on the device 404. In one embodiment, the testing includes testing to determine with internal ECC a number of errors present in the new device, and can configure internal error correction for the device when it is deployed or incorporated in a computing device. The manufacturer can store the number of errors as a threshold or baseline number for the memory device, 408. The manufacturer can store the number in a register or other memory or storage location within the memory device. The memory device will use the threshold number as a baseline for determination of how many errors accumulate over the life of the memory device. It will be understood that each memory device can have a different threshold, based on individual testing for the device.

In one embodiment, the threshold applies to a range of memory locations that will be tested. In one embodiment, the range of memory locations is the entire available address space for the memory device. In one embodiment, the range of memory locations is a subset of available address space for the memory device. In one embodiment, during operation when the memory device is incorporated into a system, the memory device receives an access command, 410. In one embodiment, such a command can include a command to perform error testing on a range of address space, such as all memory address space or a subset of memory address space. In one embodiment, in response to the command and/or in response to initiating error detection testing, the memory device resets an address counter that generates internal addresses, and resets an error count, 412. By resetting the error count prior to beginning error detection testing, the memory device can prevent double counting errors if a memory test is requested to be performed multiple times.

In one embodiment, the memory device generates internal addresses for operations performed to execute the requested command(s), 414. In one embodiment, the memory device determines whether an internally generated address rollover has occurred, 416. In one embodiment, in response to an address rollover, 416 YES branch, the memory device can reset the error count, 418. If address rollover has not occurred, 416 NO branch, the address has not been previously checked for errors during the current cycle of error counting. By generating addresses internally and detecting rollover, the memory device can prevent counting the same error twice for a memory location, and provide a more accurate count of errors. Thus, address rollover detection can occur each time the selected memory address space is tested.

In one embodiment, internal ECC logic within the memory device identifies and corrects SBEs in response to the requested command(s), 420. In one embodiment, the requested command is an error testing command, which triggers the memory device to sequence through an identified range of memory locations, or through all memory locations. In one embodiment, an error testing command is controlled by the memory device, and the memory device reads each memory location within the range of memory locations. Upon reading the contents of a location, the memory device can perform ECC on the contents and perform SBE correction using known techniques.

In one embodiment, detection of errors is tracked on a per-row basis to determine a row or rows having the highest number of errors within the memory device. Such per row error tracking can be accomplished through the use of multiple counters to track total errors and errors per row. In one embodiment, the highest number of errors per row is stored in addition to storing total accumulated errors. For example, a highest number of errors can be stored, and then testing or subsequent rows can result in a comparison of the current row's errors to the stored highest count. In one embodiment, address information for the row or rows detected to have the highest number of errors is also stored. If the current row's error count is equal to the highest count, the current row's address information can be stored. If the current row's error count is higher than the stored highest count, the count can be overwritten, and any address information can also be replaced by the address information for the current row. After passing through all rows in the range of addresses, the count should include the count of the highest number of errors per row, and can include address information for the row or rows to which the count applies.

The ECC logic can accumulate the total number of errors each time the test is performed. Over the lifetime of the memory device, the number of errors is likely to increase as the device ages. In one embodiment, if the last address in the range to be tested has not been reached, 422 NO branch, the memory device can increment the address and repeat testing for another memory location. In one embodiment, if the last address in the range to be tested has been reached, 422 YES branch, the ECC logic compares the number of SBEs corrected or detected during the operation testing with the stored threshold that indicates the number present from manufacturing or a number of errors present prior to incorporation of the memory device into a system, 424. The ECC logic can store the difference between the currently detected errors with the threshold number, 426. The stored difference can be referred to as an error result, an error count, or an error report.

In one embodiment, ECC logic of the memory device stores the error result in a register accessible to the host. For example, the memory device can store the error result to a mode register, a multipurpose register, or other register or storage location, which can be accessed by a memory controller or comparable logic of the host. If there is a difference in the count, the memory device has developed more errors, and the host system can be informed if the number of errors becomes too great. For example, the memory device can store the difference in a register or other memory location accessible to the host device. In one embodiment, the memory device can be configured to periodically provide the number to the host. Despite sharing the information about accumulating errors over the life of the memory device, because the memory device controls the address generation and the counter for error detection, it can reveal errors accumulated since manufacturing without revealing total error information. In one embodiment, the ECC logic of the memory device also reports address information for a row with the highest number of errors, and/or a count of errors for a row with the highest number of errors.

In one embodiment, the memory device records that the completion of testing on a range of memory locations has occurred, such as when the cycling through or passing through of all addresses within the range of memory locations has finished. In one embodiment, the system resets the count of errors detected upon start or initiation of the memory subsystem. In one embodiment, the count of errors to be reset is an internal count of errors that is compared with the threshold or baseline number of errors. In one embodiment, the count of errors is the error result that can be reset from the register or memory location where the result is stored.

Figure 5:
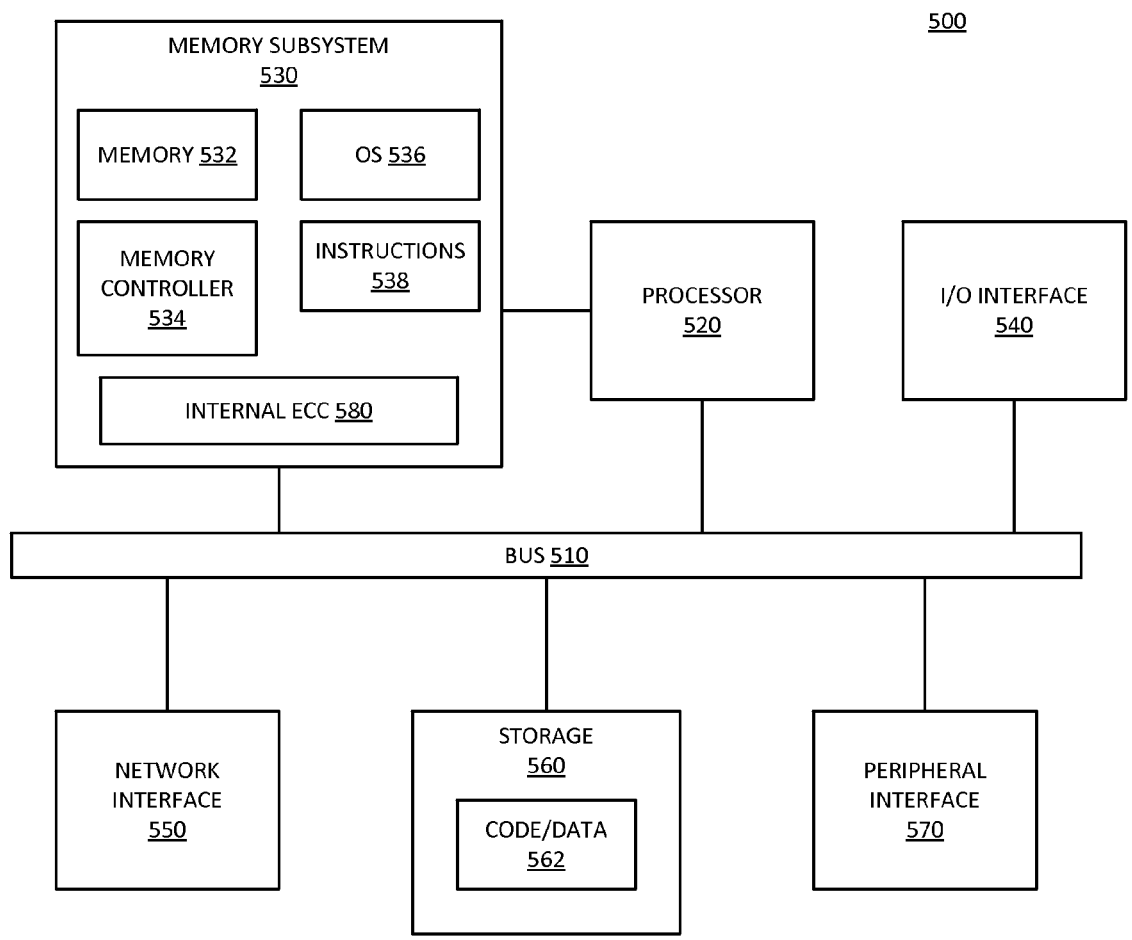
FIG. 5 is a block diagram of an embodiment of a computing system in which a memory device that generates internal addresses can be implemented.

FIG. 5 is a block diagram of an embodiment of a computing system in which a memory device that generates internal addresses can be implemented. System 500 represents a computing device in accordance with any embodiment described herein, and can be a laptop computer, a desktop computer, a server, a gaming or entertainment control system, a scanner, copier, printer, routing or switching device, or other electronic device. System 500 includes processor 520, which provides processing, operation management, and execution of instructions for system 500. Processor 520 can include any type of microprocessor, central processing unit (CPU), processing core, or other processing hardware to provide processing for system 500. Processor 520 controls the overall operation of system 500, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 530 represents the main memory of system 500, and provides temporary storage for code to be executed by processor 520, or data values to be used in executing a routine. Memory subsystem 530 can include one or more memory devices such as read-only memory (ROM), flash memory, one or more varieties of random access memory (RAM), or other memory devices, or a combination of such devices. Memory subsystem 530 stores and hosts, among other things, operating system (OS) 536 to provide a software platform for execution of instructions in system 500. Additionally, other instructions 538 are stored and executed from memory subsystem 530 to provide the logic and the processing of system 500. OS 536 and instructions 538 are executed by processor 520. Memory subsystem 530 includes memory device 532 where it stores data, instructions, programs, or other items. In one embodiment, memory subsystem includes memory controller 534, which is a memory controller to generate and issue commands to memory device 532. It will be understood that memory controller 534 could be a physical part of processor 520.

Processor 520 and memory subsystem 530 are coupled to bus/bus system 510. Bus 510 is an abstraction that represents any one or more separate physical buses, communication lines/interfaces, and/or point-to-point connections, connected by appropriate bridges, adapters, and/or controllers. Therefore, bus 510 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 510 can also correspond to interfaces in network interface 550.

System 500 also includes one or more input/output (I/O) interface(s) 540, network interface 550, one or more internal mass storage device(s) 560, and peripheral interface 570 coupled to bus 510. I/O interface 540 can include one or more interface components through which a user interacts with system 500 (e.g., video, audio, and/or alphanumeric interfacing). Network interface 550 provides system 500 the ability to communicate with remote devices (e.g., servers, other computing devices) over one or more networks. Network interface 550 can include an Ethernet adapter, wireless interconnection components, USB (universal serial bus), or other wired or wireless standards-based or proprietary interfaces.

Storage 560 can be or include any conventional medium for storing large amounts of data in a nonvolatile manner, such as one or more magnetic, solid state, or optical based disks, or a combination. Storage 560 holds code or instructions and data 562 in a persistent state (i.e., the value is retained despite interruption of power to system 500). Storage 560 can be generically considered to be a "memory," although memory 530 is the executing or operating memory to provide instructions to processor 520. Whereas storage 560 is nonvolatile, memory 530 can include volatile memory (i.e., the value or state of the data is indeterminate if power is interrupted to system 500).

Peripheral interface 570 can include any hardware interface not specifically mentioned above. Peripherals refer generally to devices that connect dependently to system 500. A dependent connection is one where system 500 provides the software and/or hardware platform on which operation executes, and with which a user interacts.

In one embodiment, memory subsystem 530 includes internal ECC logic 580, which represents logic to manage internal ECC for memory 532 in accordance with any embodiment described herein. In one embodiment, internal ECC 580 generates the addresses for making a pass through reading to perform error testing. Internal ECC 580 can generate a relative count indicating how many errors have accumulated since the device was manufactured. Thus, the number of errors can be exposed to show how many errors have developed since the device was manufactured. In one embodiment, internal ECC 580 can include logic to reset an internal counter that provides the error accumulation information.

Figure 6:
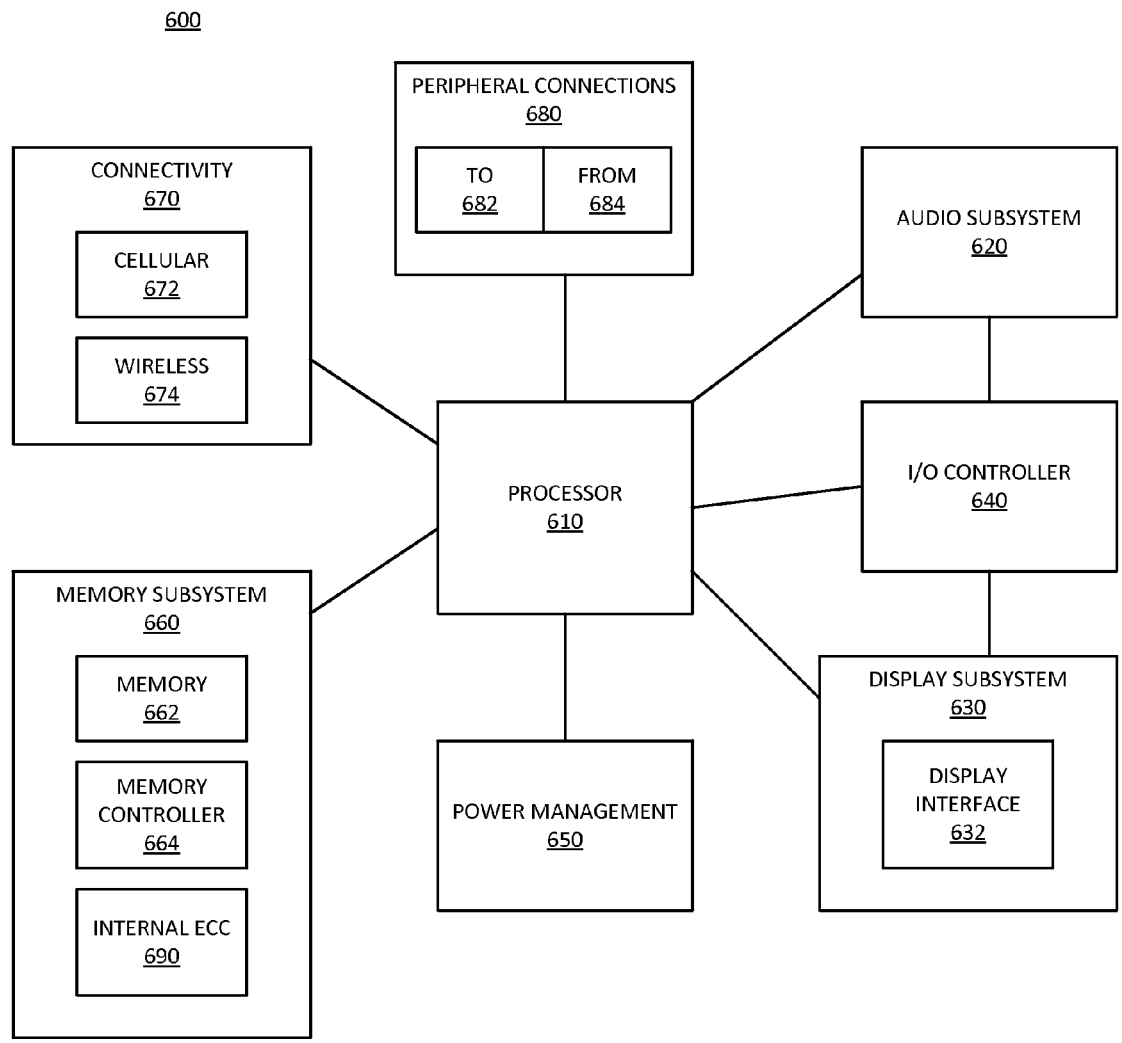
FIG. 6 is a block diagram of an embodiment of a mobile device in which a memory device that generates internal addresses can be implemented.

FIG. 6 is a block diagram of an embodiment of a mobile device in which a memory device that generates internal addresses can be implemented. Device 600 represents a mobile computing device, such as a computing tablet, a mobile phone or smartphone, a wireless-enabled e-reader, wearable computing device, or other mobile device. It will be understood that certain of the components are shown generally, and not all components of such a device are shown in device 600.

Device 600 includes processor 610, which performs the primary processing operations of device 600. Processor 610 can include one or more physical devices, such as microprocessors, application processors, microcontrollers, programmable logic devices, or other processing means. The processing operations performed by processor 610 include the execution of an operating platform or operating system on which applications and/or device functions are executed. The processing operations include operations related to I/O (input/output) with a human user or with other devices, operations related to power management, and/or operations related to connecting device 600 to another device. The processing operations can also include operations related to audio I/O and/or display I/O.

In one embodiment, device 600 includes audio subsystem 620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 600, or connected to device 600. In one embodiment, a user interacts with device 600 by providing audio commands that are received and processed by processor 610.

Display subsystem 630 represents hardware (e.g., display devices) and software (e.g., drivers) components that provide a visual and/or tactile display for a user to interact with the computing device. Display subsystem 630 includes display interface 632, which includes the particular screen or hardware device used to provide a display to a user. In one embodiment, display interface 632 includes logic separate from processor 610 to perform at least some processing related to the display. In one embodiment, display subsystem 630 includes a touchscreen device that provides both output and input to a user. In one embodiment, display subsystem 630 includes a high definition (HD) display that provides an output to a user. High definition can refer to a display having a pixel density of approximately 100 PPI (pixels per inch) or greater, and can include formats such as full HD (e.g., 1080p), retina displays, 4K (ultra high definition or UHD), or others.

I/O controller 640 represents hardware devices and software components related to interaction with a user. I/O controller 640 can operate to manage hardware that is part of audio subsystem 620 and/or display subsystem 630. Additionally, I/O controller 640 illustrates a connection point for additional devices that connect to device 600 through which a user might interact with the system. For example, devices that can be attached to device 600 might include microphone devices, speaker or stereo systems, video systems or other display device, keyboard or keypad devices, or other I/O devices for use with specific applications such as card readers or other devices.

As mentioned above, I/O controller 640 can interact with audio subsystem 620 and/or display subsystem 630. For example, input through a microphone or other audio device can provide input or commands for one or more applications or functions of device 600. Additionally, audio output can be provided instead of or in addition to display output. In another example, if display subsystem includes a touchscreen, the display device also acts as an input device, which can be at least partially managed by I/O controller 640. There can also be additional buttons or switches on device 600 to provide I/O functions managed by I/O controller 640.

In one embodiment, I/O controller 640 manages devices such as accelerometers, cameras, light sensors or other environmental sensors, gyroscopes, global positioning system (GPS), or other hardware that can be included in device 600. The input can be part of direct user interaction, as well as providing environmental input to the system to influence its operations (such as filtering for noise, adjusting displays for brightness detection, applying a flash for a camera, or other features). In one embodiment, device 600 includes power management 650 that manages battery power usage, charging of the battery, and features related to power saving operation.

Memory subsystem 660 includes memory device(s) 662 for storing information in device 600. Memory subsystem 660 can include nonvolatile (state does not change if power to the memory device is interrupted) and/or volatile (state is indeterminate if power to the memory device is interrupted) memory devices. Memory 660 can store application data, user data, music, photos, documents, or other data, as well as system data (whether long-term or temporary) related to the execution of the applications and functions of system 600. In one embodiment, memory subsystem 660 includes memory controller 664 (which could also be considered part of the control of system 600, and could potentially be considered part of processor 610). Memory controller 664 includes a scheduler to generate and issue commands to memory device 662.

Connectivity 670 includes hardware devices (e.g., wireless and/or wired connectors and communication hardware) and software components (e.g., drivers, protocol stacks) to enable device 600 to communicate with external devices. The external device could be separate devices, such as other computing devices, wireless access points or base stations, as well as peripherals such as headsets, printers, or other devices.

Connectivity 670 can include multiple different types of connectivity. To generalize, device 600 is illustrated with cellular connectivity 672 and wireless connectivity 674. Cellular connectivity 672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 674 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 680 include hardware interfaces and connectors, as well as software components (e.g., drivers, protocol stacks) to make peripheral connections. It will be understood that device 600 could both be a peripheral device ("to" 682) to other computing devices, as well as have peripheral devices ("from" 684) connected to it. Device 600 commonly has a "docking" connector to connect to other computing devices for purposes such as managing (e.g., downloading and/or uploading, changing, synchronizing) content on device 600. Additionally, a docking connector can allow device 600 to connect to certain peripherals that allow device 600 to control content output, for example, to audiovisual or other systems.

In addition to a proprietary docking connector or other proprietary connection hardware, device 600 can make peripheral connections 680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one embodiment, memory subsystem 660 includes internal ECC logic 690, which represents logic to manage internal ECC for memory 662 in accordance with any embodiment described herein. In one embodiment, internal ECC 690 generates the addresses for making a pass through reading to perform error testing. Internal ECC 690 can generate a relative count indicating how many errors have accumulated since the device was manufactured. Thus, the number of errors can be exposed to show how many errors have developed since the device was manufactured. In one embodiment, internal ECC 690 can include logic to reset an internal counter that provides the error accumulation information.

In one aspect, a method for managing error correction information in a memory includes: performing error detection internally within a memory device for a range of memory locations; incrementing an internal count for each error detected; generating an error result indicating a difference between the internal count and a baseline number of errors preset for the memory device, the preset based on a number of errors detected for the memory device prior to incorporation into a system; and providing the error result to an associated host of the system to expose only a number of errors accumulated after incorporation of the memory device into the system.

In one embodiment, performing the error detection comprises performing a series of operations to detect errors in response to an error testing command received from the host. In one embodiment, performing the error detection for the range of memory locations comprises performing error detection for the entire memory device. In one embodiment, performing the error detection further comprises internally generating addresses within the memory device for the range of memory locations. In one embodiment, incrementing the internal count for each error detected further comprises incrementing the count for each single bit error (SBE) detection and correction performed in the range of memory locations. In one embodiment, the baseline number of errors comprises a number of errors detected during manufacturing testing for the memory device. In one embodiment, providing the error result further comprises storing the error result in register for access by the host. In one embodiment, providing the error result further comprises indicating a row with a highest number of errors. In one embodiment, indicating the row with the highest number of errors comprises reporting an address of the row and a number of errors in the row. In one embodiment, further comprising resetting the internal count upon completion of the range of memory locations.

In one aspect, a memory device with internal error correction includes: error detection logic internal within the memory device to perform internal error detection for a range of memory locations; a counter to increment an internal count for each error detected; comparator logic to generate an error result indicating a difference between the internal count and a baseline number of errors preset for the memory device, the preset based on a number of errors detected for the memory device prior to incorporation into a system; and a register to store the error report for access by an associated host without exposing the baseline number.

In one embodiment, the error detection logic to perform the internal error detection is capable to perform a series of operations to detect errors in response to an error testing command received from the associated host. In one embodiment, the error detection logic to perform the internal error detection for the range of memory locations is capable to perform error detection for the entire memory device. In one embodiment, the error detection logic to perform the internal error detection is capable to internally generate addresses within the memory device for the range of memory locations. In one embodiment, the counter to increment the internal error count comprises the counter capable to increment the internal count for each single bit error (SBE) detection and correction performed in the range of memory locations. In one embodiment, the baseline number of errors comprises a number of errors detected during manufacturing testing for the memory device. In one embodiment, the counter further capable to reset the internal count upon completion of the range of memory locations. In one embodiment, further comprising the error detection logic to identify a row with a highest number of errors, and storage to store an indication of the row with the highest number of errors. In one embodiment, the indication comprises an address of the row and a number of errors in the row. In one embodiment, the storage comprises the register.

In one aspect, a system includes: a memory controller to couple to a memory device, the memory controller capable to generate an error detection command for a coupled memory device; a memory device to couple to the memory controller, the memory device including input/output (I/O) logic to receive a command from the memory controller; ECC (error correction code) logic capable to perform ECC internally within the memory device to correct single bit errors (SBEs) detected in data fetched from a range of memory locations, generate an error count indicating a number of SBEs corrected in excess of a baseline number of SBEs preset for the memory device, and provide the error count to the memory controller without exposing the baseline number.

The system wherein the memory device is a memory device in accordance with any embodiment of the aspect of a memory device set forth above. In one aspect, and apparatus comprising means performing operations to execute a method for managing error correction information in accordance with any embodiment of an aspect of the method. In one aspect, an article of manufacture comprising a computer readable storage medium having content stored thereon, which when access causes the performance of operations to execute a method for managing error correction information in accordance with any embodiment of an aspect of the method.

In one aspect, a second method for managing error correction information in a memory includes: fetching data in a memory device in response to a read access request from an associated memory controller; performing internal error correction in the memory device to correct single bit errors (SBEs) detected in the fetched data; generating an error count indicating a number of SBEs corrected in excess of a baseline number of SBEs preset for the memory device based on manufacturing testing; and providing the error count to the memory controller to expose only a number of SBEs accumulated after manufacturing.

In one embodiment, the read access request is part of an error detection testing routine generated by the memory controller. In one embodiment, performing the internal error correction further comprises internally generating addresses within the memory device for fetching the data. In one embodiment, providing the error count comprises storing the error count in register for access by the memory controller. In one embodiment, further comprising resetting the error count upon completion of a range of memory locations. In one embodiment, further comprising resetting the error count upon initiation of the memory device. In one embodiment, further comprising: identifying a row with a highest number of SBEs; and providing an indication of the row with the highest number of SBEs. In one embodiment, the indication comprises an address of the row and a number of errors in the row.

In one aspect, a memory device with internal error correction includes: logic internal to the memory device to fetch data in response to a read access request from an associated memory controller and perform internal error correction to correct single bit errors (SBEs) detected in the fetched data; a counter to increment an error count indicating a number of SBEs corrected in excess of a baseline number of SBEs preset for the memory device based on manufacturing testing; and logic to provide the error count to the memory controller to expose only a number of SBEs accumulated after manufacturing.

The second memory device further to include features for execution in accordance with any embodiment of an aspect of the second method. In one aspect, an apparatus comprising means performing operations to execute a method for managing error correction information in accordance with any embodiment of an aspect of the second method. In one aspect, an article of manufacture comprising a computer readable storage medium having content stored thereon, which when access causes the performance of operations to execute a method for managing error correction information in accordance with any embodiment of an aspect of the second method.

In one aspect, a third method for managing error correction information in a memory includes: receiving a command at a memory device from an associated memory controller; generating addresses internally with the memory device to perform operations to execute the command; performing internal error correction in the memory device to correct single bit errors (SBEs) detected in the fetched data; generating an error count indicating a number of SBEs corrected in excess of a baseline number of SBEs preset for the memory device based on manufacturing testing; and providing the error count to the memory controller to expose only a number of SBEs accumulated after manufacturing.

In one embodiment, performing the error detection comprises performing a series of operations to detect errors in response to an error testing command received from the host. In one embodiment, performing the error detection for the range of memory locations comprises performing error detection for the entire memory device. In one embodiment, performing the error detection further comprises internally generating addresses within the memory device for the range of memory locations. In one embodiment, generating the error count comprises incrementing the count for each single bit error (SBE) detection and correction performed in the range of memory locations in excess of the baseline. In one embodiment, generating the error count further comprises incrementing the count for each SBE detection and correction performed, comparing the count to the baseline, and storing only the number of SBEs in excess of the baseline. In one embodiment, the baseline number of errors comprises a number of errors detected during manufacturing testing for the memory device. In one embodiment, providing the error count further comprises storing the error count in a register for access by the host. In one embodiment, further comprising resetting the error count upon completion of the range of memory locations. In one embodiment, further comprising: identifying a row with a highest number of SBEs; and providing an indication of the row with the highest number of SBEs. In one embodiment, the indication comprises an address of the row and a number of errors in the row.

In one aspect, a memory device with internal error correction includes: logic internal to the memory device to receive a command from an associated memory controller, generate addresses internally with the memory device to perform operations to execute the command, and perform internal error correction to correct single bit errors (SBEs) detected in the fetched data; a counter to generate an error count indicating a number of SBEs corrected in excess of a baseline number of SBEs preset for the memory device based on manufacturing testing; and logic to provide the error count to the memory controller to expose only a number of SBEs accumulated after manufacturing.

The third memory device further to include features for execution in accordance with any embodiment of an aspect of the third method. In one aspect, and apparatus comprising means performing operations to execute a method for managing error correction information in accordance with any embodiment of an aspect of the third method. In one aspect, an article of manufacture comprising a computer readable storage medium having content stored thereon, which when access causes the performance of operations to execute a method for managing error correction information in accordance with any embodiment of an aspect of the third method.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A method for managing error correction information in a memory, comprising:
    performing error detection internally within a memory device for a range of memory locations;
    incrementing an internal count in response to detection of an error;
    generating an error result indicating a difference between the internal count and a non-zero baseline number of errors preset for the memory device, the preset based on a number of errors detected for the memory device prior to incorporation into a system; and
    providing the error result to an associated host of the system to expose only a number of errors accumulated after incorporation of the memory device into the system.

2. The method of claim 1, wherein performing the error detection comprises performing a series of operations to detect errors in response to an error testing command received from the host.

3. The method of claim 1, wherein performing the error detection for the range of memory locations comprises performing error detection for the entire memory device.

4. The method of claim 1, wherein performing the error detection further comprises internally generating addresses within the memory device for the range of memory locations.

5. The method of claim 1, wherein incrementing the internal count further comprises incrementing the count for single bit error (SBE) corrections performed in the range of memory locations.

6. The method of claim 1, wherein the baseline number of errors comprises a number of errors detected during manufacturing testing for the memory device.

7. The method of claim 1, wherein providing the error result further comprises storing the error result in register for access by the host.

8. The method of claim 1, wherein providing the error result further comprises indicating a row with a highest number of errors.

9. The method of claim 8, wherein indicating the row with the highest number of errors comprises reporting an address of the row and a number of errors in the row.

10. The method of claim 1, further comprising resetting the internal count in response to completion of error detection for the range of memory locations.

11. A memory device with internal error correction, comprising:
    error detection logic internal within the memory device to perform internal error detection for a range of memory locations;
    a counter to increment an internal count in response to detection of an error;
    comparator logic to generate an error result indicating a difference between the internal count and a non-zero baseline number of errors preset for the memory device, the preset based on a number of errors detected for the memory device prior to incorporation into a system; and
    a register to store the error report for access by an associated host without exposing the baseline number.

12. The memory device of claim 11, wherein the error detection logic to perform the internal error detection is capable to perform a series of operations to detect errors in response to an error testing command received from the associated host.

13. The memory device of claim 11, wherein the error detection logic to perform the internal error detection for the range of memory locations is capable to perform error detection for the entire memory device.

14. The memory device of claim 11, wherein the error detection logic to perform the internal error detection is capable to internally generate addresses within the memory device for the range of memory locations.

15. The memory device of claim 11, wherein the counter to increment the internal error count comprises the counter capable to increment the internal count for single bit error (SBE) corrections performed in the range of memory locations.

16. The memory device of claim 11, wherein the baseline number of errors comprises a number of errors detected during manufacturing testing for the memory device.

17. The memory device of claim 11, wherein the counter further capable to reset the internal count upon completion of the range of memory locations.

18. A system comprising:
    a memory controller to couple to a memory device, the memory controller capable to generate an error detection command for a coupled memory device;
    a memory device to couple to the memory controller, the memory device including
        input/output (I/O) logic to receive a command from the memory controller;
        ECC (error correction code) logic capable to perform ECC internally within the memory device to correct single bit errors (SBEs) detected in data fetched from a range of memory locations, generate an error count to indicate a number of SBEs corrected in excess of a non-zero baseline number of SBEs preset for the memory device, and provide the error count to the memory controller without an indication of the baseline number.

19. The system of claim 18, wherein the ECC logic further capable to internally generate addresses within the memory device for the range of memory locations.

20. The system of claim 18, wherein the baseline number of errors comprises a number of errors detected during manufacturing testing for the memory device.

21. The system of claim 18, wherein the ECC logic further capable to reset the error count upon completion of the range of memory locations.

22. The system of claim 18, wherein the memory controller, responsive to receipt of the error count from the memory device, capable to use the error count as metadata for system-wide ECC operations.

23. The system of claim 18, further comprising at least one processor and a network interface, the at least one processor communicatively coupled to the memory controller and the network interface communicatively coupled to the at least one processor.

* * * * *